(12) United States Patent
Oppermann et al.

(10) Patent No.: US 8,564,969 B2
(45) Date of Patent: Oct. 22, 2013

(54) COMPONENT ARRANGEMENT AND METHOD FOR PRODUCTION THEREOF

(75) Inventors: Hans-Hermann Oppermann, Berlin (DE); Matthias Klein, Berlin (DE); Michael Toepper, Berlin (DE); Juergen Wolf, Berlin (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 182 days.

(21) Appl. No.: 13/138,440

(22) PCT Filed: Feb. 19, 2010

(86) PCT No.: PCT/EP2010/001211
§ 371 (c)(1),
(2), (4) Date: Oct. 27, 2011

(87) PCT Pub. No.: WO2010/094511
PCT Pub. Date: Aug. 26, 2010

(65) Prior Publication Data
US 2012/0039056 A1  Feb. 16, 2012

(30) Foreign Application Priority Data
Feb. 19, 2009  (DE) .......................... 10 2009 009 828

(51) Int. Cl.
*H05K 7/14* (2006.01)
(52) U.S. Cl.
USPC ........................................................ 361/790
(58) Field of Classification Search
USPC .......................... 361/790, 785, 735, 792, 784
See application file for complete search history.

(56) References Cited

U.S. PATENT DOCUMENTS

| | | | |
|---|---|---|---|
| 4,818,728 A | 4/1989 | Rai et al. | |
| 6,239,383 B1 | 5/2001 | Lin | |
| 7,098,073 B1 | 8/2006 | Mangrum | |
| 7,217,646 B2 * | 5/2007 | Hedler et al. | 438/612 |
| 7,547,625 B2 | 6/2009 | Beyne et al. | |
| 7,824,960 B2 | 11/2010 | Hao et al. | |
| 7,847,417 B2 * | 12/2010 | Araki et al. | 257/778 |
| 7,880,315 B2 | 2/2011 | Beyne et al. | |
| 2009/0250812 A1 | 10/2009 | Araki et al. | |

FOREIGN PATENT DOCUMENTS

| | | |
|---|---|---|
| DE | 10 2006 020 869 A1 | 11/2007 |
| DE | 10 2006 045 094 A1 | 3/2008 |
| EP | 0 270 067 A2 | 6/1988 |
| EP | 1 732 116 A2 | 12/2006 |

* cited by examiner

*Primary Examiner* — Timothy Thompson
*Assistant Examiner* — Andargie M Aychillhum
(74) *Attorney, Agent, or Firm* — Marshall & Melhorn, LLC

(57) ABSTRACT

The invention relates to a component arrangement with a first substrate and at least one second substrate arranged on the first substrate, wherein the first substrate has at least one first contact element and the at least one second substrate has at least one second contact element and the contact elements each has a contact surface connected such as to give an electrical contact and a protective layer connecting the first and second substrate together. During production the protective layer is structured such that a part surface of the first substrate and a part surface of the at least one second substrate are not covered, wherein the part surfaces include the contact surfaces of the at least one first and second contact elements and the contact generated between the contact surfaces is hence not contaminated by the protective layer. The contact surfaces are thus freely accessible without elements of the protective layer lying therebetween. An improved electrical conductivity with constant mechanical stability is thus generated.

18 Claims, 10 Drawing Sheets

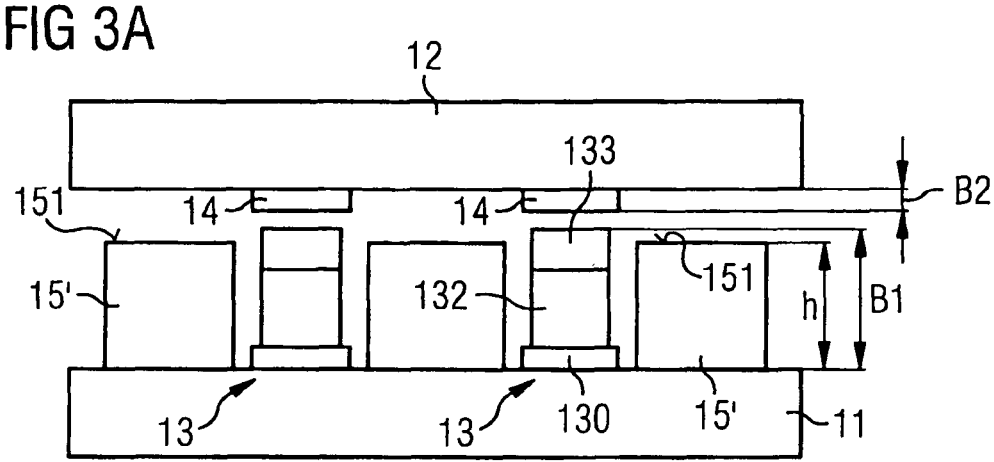
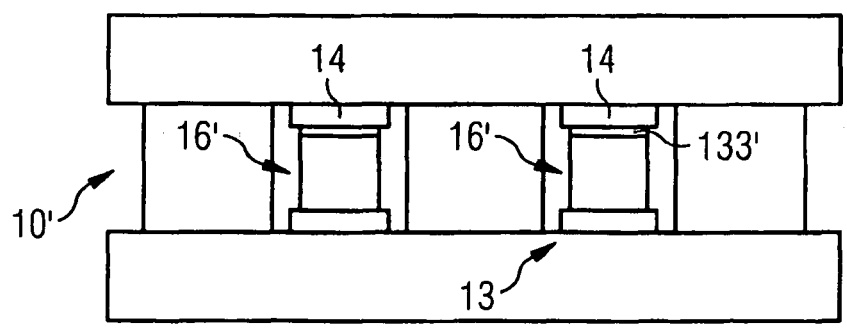

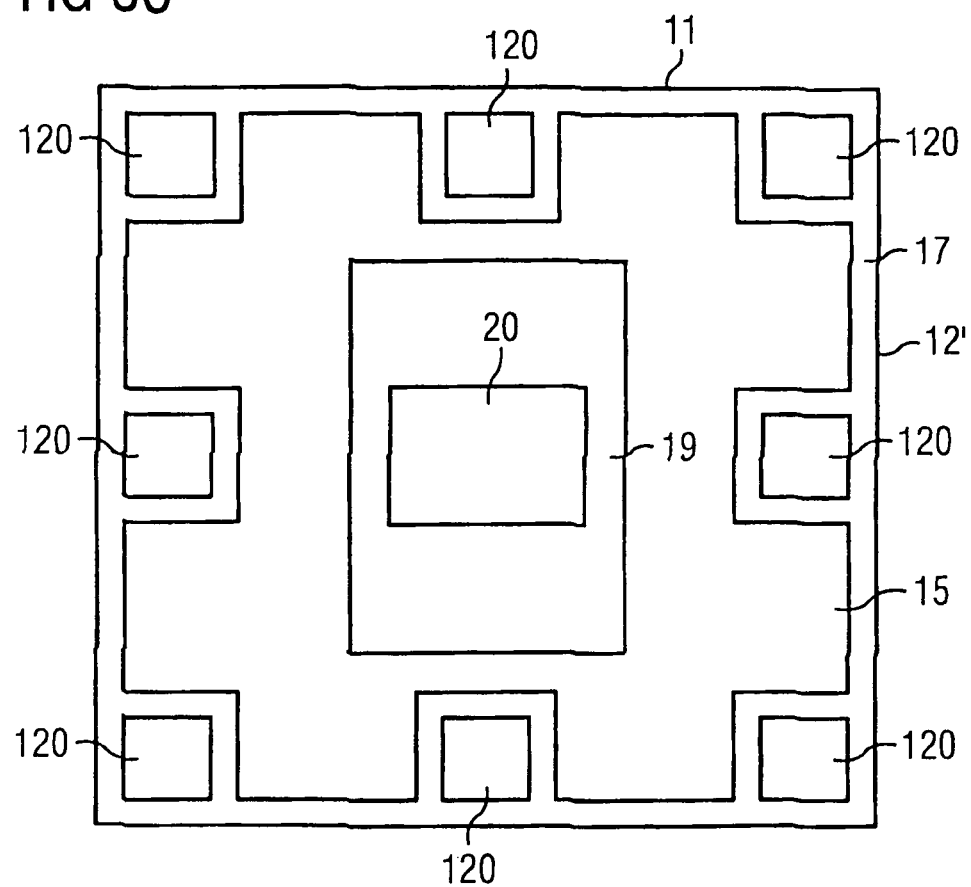

COMPONENT ARRANGEMENT AND METHOD FOR PRODUCTION THEREOF

BACKGROUND OF THE INVENTION

The subject of the present invention is a component arrangement, preferably an electronic component arrangement, having a first substrate and at least one second substrate which is disposed on the first substrate, e.g. an electronic component, such as an unhoused integrated circuit or similar, the first substrate having at least one first contact element and the at least one electronic component having at least one second contact element and the contact elements which are connected to each other to form an electrical contacting and each contact element having a contact surface, and the component arrangement having furthermore a support layer which connects the first substrate and the at least one second substrate, and also a method for production of such a component arrangement.

In the case of flip-chip assembly, an electronic component is mounted with its contact terminals towards a substrate, the contact elements of the component being contacted respectively with the oppositely situated contact elements of the substrate. As a result, an electrical contacting is produced which connects the substrate to the electronic component conductively to form an electronic component arrangement. Between the electronic component and the substrate there remains however a gap and there are often compelling reasons for filling the gap between the component and the substrate.

By filling the gap, the mechanical stability of the electronic component arrangement can be improved since, in the case of temperature changes and the thereby occurring mechanical stresses due to the different coefficients of expansion between substrate and electronic component element, the filling relieves the load on the electrical contactings. Furthermore, penetration of particles and liquids into the gap is prevented and consequently possible short circuits or corrosion are avoided. Protection by a filling is required at the latest during sawing or separation of the substrates or later under operating conditions. Such substrates can be for example silicon wafers, a laminate or a glass, on which an electronic component, such as an unhoused IC component or even a further substrate is mounted.

In prior art, generally a so-called encapsulation compound is used, also termed underfiller. The underfiller is generally a polymer which is deposited directly next to the chip and is drawn into the gap as a result of capillary forces. Subsequently, the underfiller is cured at fairly high temperatures. The underfiller is filled with particles in order to lower the thermal coefficient of expansion of the polymer and to reduce the mechanical stresses. In addition to the long process times for filling the gap, also the requirement for sufficient space next to the gap is disadvantageous in the use of underfillers since the liquid polymer material must be deposited there and possibly must be relaid several times in order to provide the necessary volume for filling the gap.

For this reason, a method has been developed in which firstly the underfiller is applied and subsequently the electronic component with for example solder bumps as contact elements is pressed into the liquid underfiller until the solder bumps reach the contact elements of the substrate, melt and produce the electrical contacting. At the same time, the underfiller is cured. For this purpose, supplements must be added which promote wetting in the underfiller in order to reduce the oxides and for protection from renewed oxidation during the soldering. Underfillers of this type cannot however be filled sufficiently and hence the thermal coefficient of expansion is not adequately lowered. In addition, the assembly of the electronic component on the substrate is relatively difficult: thus the individual electronic components must be pressed onto the substrate with a tool during bonding in order to avoid floating and hence a loss of electronic contact. However, too strong pressure forces lead to the solder being pressed out of a solder bump and electrical short circuits between the contacts. A further disadvantage of the above-described method is the high tendency for pore formation in the underfiller, which further reduces the reliability.

Another possibility for circumventing the introduction of an underfiller after production of the electrical contacting between the electronic component and the substrate is associated with flip-chip assembly by means of gluing. There are two method variants here: firstly, gluing with unfilled adhesives (non-conductive adhesive, NCA) and, on the other hand, the use of anisotropically conductive adhesives (anisotropic conductive adhesive, ACA). In both cases, gold bumps are generally applied on the chip side as contact elements, the adhesive is applied on the substrate side, and the non-melting bumps of the chip are pressed into the liquid adhesive with a hot tool, the adhesive completely wetting the chip surface and curing. In the case of the NCA variant, a gold bump is pressed against the terminal contact on the substrate side. The adhesive shrinks during curing of the adhesive and produces a permanent pressure contact between the bump and the substrate terminal. In the case of the ACA variant, small conductive particles with almost the same diameter are contained in the adhesive, the particles being jammed between the gold bump and the substrate terminal and ensuring the electrical contact after curing.

A third variant for the assembly of chips on wafers is proposed by the Interuniversity Microelectronics Centre (IMEC). In the proposed process, firstly a thin polymer layer is applied on the wafer and subsequently the electric component, provided with copper bumps, is placed on the adhesive. With the help of a tool, the chips are pressed against the wafer finally with application of temperature and pressure (thermocompression), the polymer layer melting, the copper bumps displacing the polymer locally and being welded with an oppositely situated copper pad which is applied on the substrate as contact element. Since however copper can only be welded with difficulty, inadequate contact must be accepted, which is sustained by the shrinkage and the curing of the polymer.

BRIEF SUMMARY OF THE INVENTION

It is the object of the present invention to provide a component arrangement, in particular an electronic component arrangement, and also a method for production thereof which does not have the above-mentioned disadvantages and ensures a good electrical connection and also good mechanical stability.

The object is achieved by a method for production of a component arrangement according to the main claim and also by a component arrangement according to the coordinated claim. Various embodiments of the method or of the component arrangement are cited in the subordinate claims.

In the case of the component arrangement, a support layer is applied on a first substrate and/or at least one second substrate, the support layer being structured such that, in the connected state between the first substrate and the at least one second substrate disposed on the first substrate, a partial surface of the first substrate and a partial surface of the at least one second substrate, corresponding to said first substrate, are not covered by the support layer and the partial surfaces surround the respective contact surface of the at least one first and second contact element and the electrical contacting produced between the contact surfaces is not contaminated by the support layer.

As a result of the fact that the support layer does not cover the contact surface of the at least one first and at least one second contact element, the at least one first and the at least one second contact element can be connected together to form an electrical contacting without the applied support layer requiring to be displaced and remaining in the ever reducing gap between the contact surface of the at least one first contact element and the contact surface of the at least one second contact element and hence leading to contamination or even short circuits.

For this purpose, firstly the at least one first and at least one second contact element are applied on the first substrate or the at least one second substrate, the at least one first and second contact element respectively having a contact surface orientated away from the first substrate or away from the at least one second substrate.

The at least one first and at least one second contact element thereby occupy a base area on the first substrate or on the at least one second substrate, which can be slightly larger than or equal to the size of the contact surface.

The contact elements can be applied by the methods as known from prior art. There are included herein inter alia evaporation coating, sputtering or mechanical placing of contact elements. The contact elements can also be applied galvanically.

Furthermore, a support layer is applied on the first substrate and/or the at least one second substrate, it being preferred if the support layer is applied merely on the first substrate or on the at least one second substrate. The support layer is applied or structured such that it does not cover a partial surface of the first substrate or of the at least one second substrate or the partial surface is exposed and the partial surface surrounds the contact surfaces of at least two first contact elements but does not touch the contact surface itself. Therefore within the partial surface, at least two electrical contact surfaces are provided. A partial surface is continuous and surrounds at least two contactings or two first or second contact elements. The partial surface does not require to include the entire surface left free of the support layer. In particular, a plurality of non-continuous partial surfaces can be present. A partial surface has a partial base area surrounding the contact element and comprises at least two partial base areas which surround the respective contact element and are connected to each other via a connection surface and a connection surface which is in contact externally.

Between the at least two electrical contactings or the first or second contact elements and the support layer, a channel is formed, the "outline" of which is prescribed by the partial surface and which is in communication with the exterior at least in front of a possible encapsulation. Purging of the contact surfaces with for example a gas is possible via the channel, which gas is conducted from outside into the inside of the arrangement. As mentioned already with respect to the partial surfaces, also a plurality of channels can be provided independently of each other, which are connected respectively to the exterior. As a result, all contact surfaces should be reached by the purge gas. The length and width of the channels must take into account diffusion of the process gas and transport away of the gaseous process products.

The partial base areas which surround a contacting can have an oval, round or n-angle shape, n being able to be a natural number of at least 3 or more.

As a result of the mentioned measures, the contact surfaces of the first or second contact element are free of the support layer and in particular freely accessible so that, in the case of the electrical contacting to be undertaken between the first and second contact elements, no residues of the support layer remain between the contact surfaces of the first contact element and of the second contact element.

The support layer can be applied or structured either before or after application of the first or second contact elements. The structuring is effected either via subtractive or additive processes. This means that the support layer can be applied in an already structured manner for example by stamping, printing or electrophoresis or can be structured subsequently by exposure with photoresistive formulations, by means of a photoresist or by etching processes so that the contact surfaces of the first or second contact elements are exposed. If the first or second contact elements are applied only after structuring of the support layer, then the support layer must be structured such that the base area which the first or second contact elements occupies on the first substrate or the at least one second substrate is not covered by the support layer and is freely accessible for application of the at least one first or second contact element.

After the support layer and the contact elements have been applied, the contact surface of the first contact element is connected to the corresponding contact surface of the second contact element in order to produce the electrical contacting to each other. The support layer can hereby serve at the same time as spacer between the first substrate and the at least one second substrate. As a result, the at least one second substrate is prevented from being pressed too tightly onto the first substrate. Because of the structuring of the support layer, the contact surfaces, as mentioned already several times, are free of the support layer and touch so that no contamination by the support layer occurs. Furthermore, the support layer need not be liquefied since the contact surfaces are freely accessible. As a result, a greatly improved conductivity of the produced electrical contacting between the one first and the at least one second contact element becomes possible.

In a variant of the component arrangement, the support layer is structured such that it does not touch the at least two electrical contactings. This means in particular that not only the contact surfaces of the at least two first or at least two second contact elements are left free but also the remaining surfaces of the contact elements which are not connected to the first substrate or to the at least one second substrate have absolutely no contact with the support layer. As a result, the conductivity of the electrical contacting or the insulation of various electrical contactings relative to each other is greatly improved.

In a further embodiment, the first substrate has a large number of first contact elements and the at least one second substrate a large number of second contact elements which correspond to the large number of first ones, at least respectively two first and second contact elements being intended to be present. Each of these contact elements has a contact surface and a support layer is structured such that an electrical contacting produced between the mutually corresponding contact surfaces is not contaminated by the support layer. Since component arrangements generally have a large number of contact elements, it is preferred if all the electrical contactings or the plurality of electrical contactings between the first substrate and the at least one second substrate were produced according to the above-portrayed method.

In a further embodiment, the support layer is applied on the first substrate and/or the at least one second substrate and a surface of the support layer which is orientated away from the first substrate or away from the at least one second substrate is supplied with an adhesive and/or the support layer itself is configured to be adhesive. As a result, it is possible during the connection of the first substrate and of the at least one second substrate to produce an integral connection by means of the adhesive effect of the support layer. As a result, the support layer can serve not only as spacer but, at the same time, can reduce or absorb the stresses of the first substrate or of the at least one second substrate which act on the electrical contactings because of the different thermal coefficients of expansion and give improved mechanical stability to the entire component arrangement.

There is possible here as support layer for example a bonding polymer so that there is no requirement for an additional adhesive layer or supply of adhesive. For this purpose, for example non-melting polymers can be used which are only incompletely crosslinked after application and structuring and have an adhesive effect at not too high temperatures. Such polymers are for example benzocyclobutanes (BCB), polyimide (PI), polybenzoaxoles (PBC)), epoxides, acrylates, but also other non-melting systems. As an alternative hereto, for example polymers can be used which are completely crosslinked already after application, the structured support layer being pressed into a thin painted-on adhesive layer and being supplied with adhesive. During connection of the first substrate to the at least one second substrate outside the partial surface, an integral connection is thus produced.

From the preceding description, it is obvious that the polymer need not be liquefied during connection of the first contact elements to the second contact elements in order to bring the contact surfaces together to form an electrical connection.

Alternative materials for the support layer are furthermore an oxide layer, a metal layer or a silicon layer, insulating adhesives for example hereby being able to be used.

In a further embodiment, the partial surface of the first substrate or of the at least one second substrate is configured such that it surrounds at least two partial base areas and the respective partial base area respectively surrounds a contact surface of the at least one first or second contact element completely and has a size of at least 120% of the size of the respective contact surface or preferably of at most 300% of the size of the respective contact surface. The partial base area thereby surrounds the base area or contact surfaces of the first or second contact element completely and does not intersect this surface. As a result of the fact that the partial base area is larger than the contact surface, a sufficient spacing which is part of this purging channel is defined between support layer and electrical contacting. In order to ensure that the support layer also ensures sufficient mechanical stability of the electronic component arrangement, the size of the respective partial base area can be restricted to 300%, preferably to 200%, particularly preferably to 160%, of the size of the respective contact surface. The size of the partial base area determines the size of the purging channel which is determined by the difference between partial base area and contact surfaces, a connection surface which can likewise be a component of the channel being provided between the partial base areas. The partial base areas can also be partially open externally, i.e. can be connected in the non-encapsulated state to the exterior.

The diameter or the length extension of the first or second contact element on the first substrate or on the at least one second substrate is between 5 µm and 1,000 µm. Typically they are however between 10 µm and 80 µm. The opening present in the support layer is chosen preferably to be larger than the contact surface and is between 7 µm and 1,500 µm, but typically between 15 µm and 100 µm.

In order to connect the first contact elements to the second contact elements, various methods can be chosen. On the one hand, the connection can be effected by means of shaping, preferably by means of thermocompression. The added height of the first and second contact element before the connection, the height being determined essentially perpendicular to the surface of the first substrate or of the at least one second substrate, hereby is greater than the height of the support layer. This means that, when the first substrate is brought together with the at least one second substrate, firstly the first contact element is connected to the second contact element and subsequently welded to the latter by means of shaping. The support layer hereby serves as spacer in order that the at least one second substrate cannot be pressed against the first substrate arbitrarily close. During additional adhesion, the mechanical stability of the entire component arrangement is increased in addition. By means of the support layer or the adhesive effect of the support layer, an integral connection between the first substrate and the at least one second substrate is therefore produced, which exists in addition to the electrical contactings. Either the first or second contact element thereby has a bump, the bump being able to be produced from ductile metals, such as for example gold, silver, indium or copper or alloys consisting thereof. The bump height can be between 5 µm and 100 µm, the support layer thickness between 3 µm and 80 µm. Typical values are at 10 µm to 30 µm for the height of the bumps and at 5 µm to 20 µm for the height of the support layer. If, in the proposed method, polymers such as BCB, PBO or polyimide which have a high curing temperature are used, it is disadvantageous to use low-melting bumps. Low-melting bumps can however be used if the support layer is already completely solidified or crosslinked.

Instead of pure thermocompression, in addition to compression, ultrasound can be used in order to weld the bumps to the contact metallisations. If the support layer finally reaches the oppositely situated surface either of the first substrate or of the at least one second substrate, the amplitude of the ultrasonic oscillation becomes ultimately negligibly small because of the damping of the support layer and the surfaces adhere. It is also possible to produce the uppermost layer of the bump or of the first or second contact element from a metallic foam which is highly compressible because of its porosity.

In a particularly advantageous embodiment which is applied in particular with a stack arrangement, firstly the support layer on the one substrate is connected to the other substrate, the height of the contact elements being less than that of the support layer. The contacting is undertaken then after the purging of the arrangement with process gas by means of soldering or remelting.

In a further embodiment, either the first or the second contact element is connected to the respectively other one by means of soldering or remelting. It is hereby advantageous if the added height of the first and of the second contact element is smaller before connection of the contact faces than the height of the support layer so that firstly the support layer produces the desired spacing between the first substrate and the at least one second substrate. Since the added height of the first and of the second contact element is less, there is still no electrical contacting between these two contact elements. If an adhesive support layer or one provided with an adhesive is used, an integral connection between the first substrate and the at least one second substrate is produced already before the remelting or soldering. The remelting or soldering of the first or second contact element leads to the melted contact element which normally comprises a bump changing its shape and generally forming a spherical surface. The spacing between the first and second contact element is chosen such that, during remelting and the subsequent shape changing of the bump, the oppositely situated contact element is touched and the bump is distributed over the entire contact surface of the oppositely situated contact element because of surface tension. As a result, the surface of the electrical contacting warps into a hyperbola.

If more than one second substrate is used or if a plurality of second substrates are stacked one above the other (although to date the method only mentions connection of a first substrate to at least one second substrate, it of course also includes the connection of a substrate to at least one electronic component or the connection between a first electronic component to at least one second electronic component), firstly, with the help of this method, the finished stack arrangements consisting of the second substrates are glued on the first substrate and subsequently the electrical contactings are produced by remelting in a single process step. In processing technology, this means great facilitation in the production of stackable arrangements, such as e.g. chips, without the quality of the electrical contacting suffering, as with the previously-known methods.

Solder bumps for remelting can be formed from different solders. Typical solders are tin-based alloys, such as SnAg, SnCu, SnAgCu, SnPb, SnIn, SnBi and also gold-rich solders, such as AuSn or indium solders. Such solders can be applied as an alloy or in layers, the solder being produced by reaction of the layers. The deposited solder height can be between 5 μm and 100 μm and the thickness of the support layer between 5 μm and 120 μm. Typical values for the solder bumps are between 5 μm and 40 μm, for the support layer between 5 μm and 50 μm.

The diameter of the bumps or the size of the partial base areas is between 5 μm and 1,000 μm, respectively 7 μm and 1,500 μm, typically between 10 μm and 80 μm, respectively 15 μm and 100 μm. Whilst the adhesion process is effected with the supply of temperature and force, only an increase in temperature without an additional application of force is required during production of the solder connection. Also further process steps can be included between the connection of the first substrate to the at least one second substrate and the subsequent remelting.

The component arrangement is purged with a gas before connection of the contact surfaces to each other via the channel/channels specified by the partial surface(s). As a result of the purging with a gas, such as for example gaseous formic acid or acetic acid or hydrogen, the oxide layers produced on the solder or on the first and second contact elements can be reduced. As a result, the quality of the electrical contacting is increased in addition. In order to be able to implement this process step as simply as possible, in particular if the first substrate is connected already to the at least one second substrate, but the electrical contacting has not yet been produced, the partial surface which is recessed through the support layer, is a continuous area which is connected to the exterior at least at one position. It is ensured as a result that the gas can purge all the surfaces or contact surfaces to be cleaned.

The gas is distributed in the purging channel between the support layer and the at least two contactings or the at least two first and second contact elements and cleans the contact surfaces. It is thereby particularly advantageous in case the component arrangement comprises a plurality of substrates.

In a further embodiment, the support layer has a further cavity, the at least one second substrate in the cavity comprising at least one sensor element, an optical or a micromechanical element. Such elements can be for example antennae, high-frequency circuits, SAW filters or ultrasonic sensors or even pressure- or acceleration sensors, micromirrors, gas-, chemo- and biosensors and also further MEMS components. Also camera chips, interferometers, optical detectors or sources can be disposed in such a cavity. Such a cavity can be introduced contemporaneously during structuring of the support layer or during application of the support layer.

In a further embodiment, an edge of the at least one second substrate can be provided with an additional encapsulation, this encapsulation reaching from the first substrate to the edge of the at least one second substrate. As a result, an improved mechanical and chemical protective function of the component arrangement is ensured.

As mentioned already, it is also possible to form a plurality of second substrates on a first substrate, either in a planar manner adjacently or stacked or in a combination of planar arrangement and stack.

For stacking, it is reasonable that the substrates or the second substrates which are situated between the first substrate and a further second substrate have through-contactings, such as through-vias.

The first and the at least one second substrate can be formed respectively by a circuit carrier made of materials, such as e.g. silicon wafers, a laminate or a glass. Alternatively, merely the first substrate can be a circuit carrier whereas the at least one second substrate is an electronic component, such as e.g. an unhoused IC component. Furthermore, the at least one second substrate can also be an optical or micromechanical element. These electronic, optical or micromechanical elements can be present in the wafer composite or separately. Of course, the first substrate can also be present as such an element.

BRIEF DESCRIPTION OF THE DRAWINGS

Both the component arrangement and the method for production of such a component arrangement are intended to be dealt with in more detail with reference to embodiments. There are shown.

DETAILED DESCRIPTION OF THE INVENTION

Figure 1A:
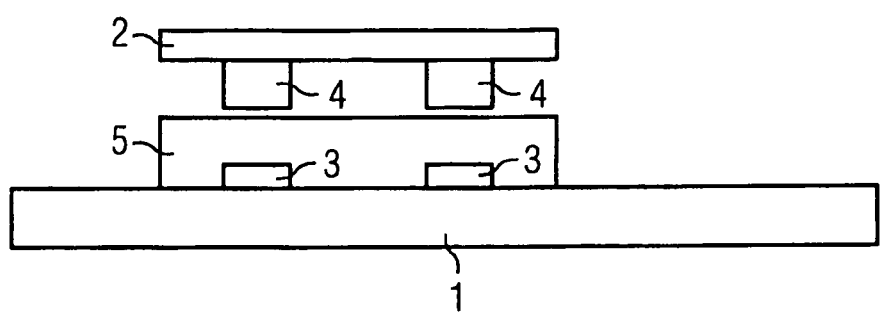
FIGS. 1a and 1b an electronic component arrangement according to the state of the art, FIGS. 2a to 2e an embodiment variant of a component arrangement according to the invention, FIGS. 3a and 3b a further embodiment variant of a component arrangement, FIGS. 4a to 4d a further embodiment variant of a component arrangement, FIGS. 5a to 5c a further embodiment variant of a component arrangement, FIGS. 6a to 6c a view on a substrate having an applied support layer in various embodiments, FIGS. 7a and 7b a planar arrangement of two electronic components on one substrate, FIG. 8a stacked arrangement of electronic components on a substrate.
Figure 1B:
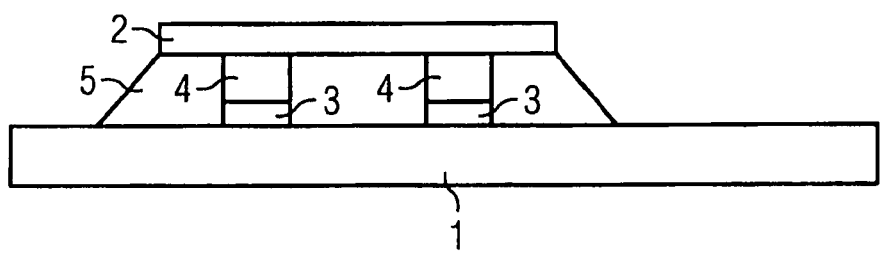

With reference to FIGS. 1a and 1b, firstly the process of introducing an underfiller before joining substrate and electronic component, which is already known from the state of the art, is intended to be explained. FIG. 1a shows a substrate 1 and an electronic component 2 which is an unhoused integrated circuit in the present case. On the substrate 1, first contact elements 3 which are formed from contact pads are situated. The electronic component 2 has second contact elements 4, the second contact elements 4 consisting of an under-metallisation and a bump applied thereon. Before joining the substrate 1 and the electronic component 2, an underfiller 5 is applied on the substrate 1. The underfiller 5 is liquefied and the electronic component 2 is pressed subsequently onto the substrate 1 so that the result is contacting of the first contact element 3 with the second contact element 4, the underfiller 5 being displaced. However, it is not always possible to avoid the underfiller remaining in the narrowing gap between the contact surfaces between the oppositely situated contact surfaces of the first contact elements 3 and the second contact elements 4 during the press-connection of the contact elements. A further problem occurs if the substrate 1 and the electronic component 2 are further pressed together and the liquid solder must thereby escape to the side and thus even leads to short circuits with adjacent solder connections.

Figure 2A:
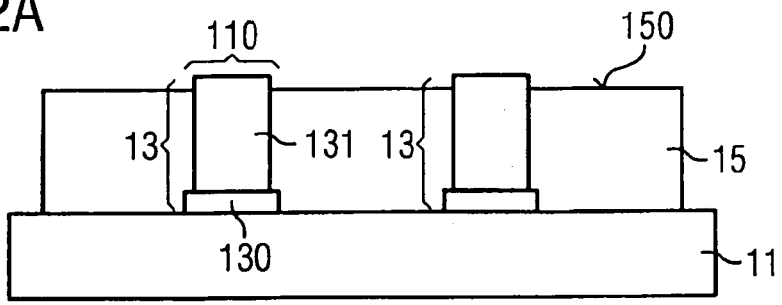

A first embodiment variant of a component arrangement according to the invention, in the present case of an electronic component arrangement, is intended to be explained with reference to FIGS. 2a to 2e. In FIG. 2a, a first substrate 11 present as circuit carrier is shown in cross-section, the first substrate 11 having first contact elements 13. The first contact elements 13 thereby comprise a contact pad 130 which serves as under-metallisation, and a bump 131 deposited thereon. The first contact elements 13 have a contact surface 110 orientated away from the first substrate 11. In the present case, the bumps are gold bumps of 25 µm height and 30 µm diameter. After the first contact elements 13 have been disposed on the first substrate 11, a 15 µm thick support layer 15 is applied. In the present case, the support layer 15 consists of benzocyclobutane (BCB).

Figure 2B:
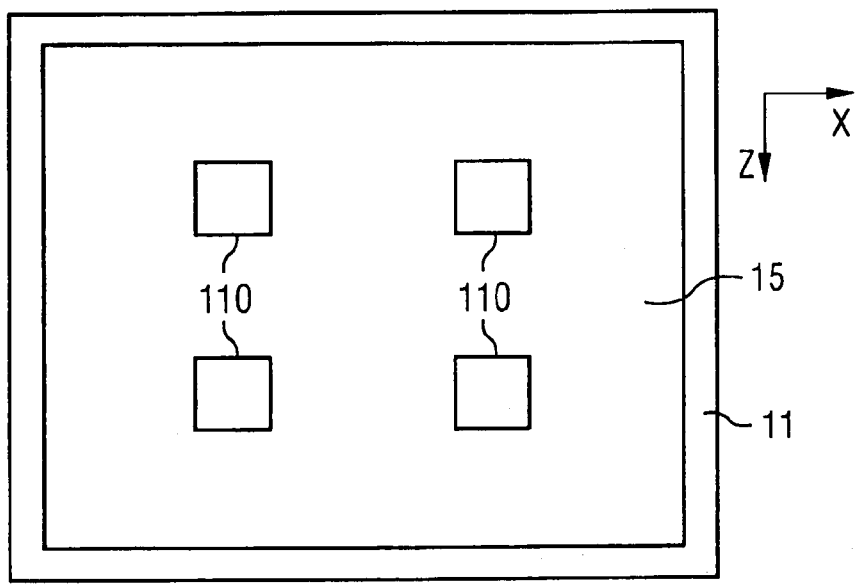

In FIG. 2b, the first substrate 11 can be seen in the view of the xz-plane. The contact surfaces 110 can be detected clearly, the contact surfaces 110 in the present case representing not only the surface of the bump 131 orientated away from the first substrate 11 but extend over the somewhat larger area of the contact pad 130. Furthermore, the support layer 15 can be seen, the metal bumps 131 still protruding out of the latter.

Figure 2C:
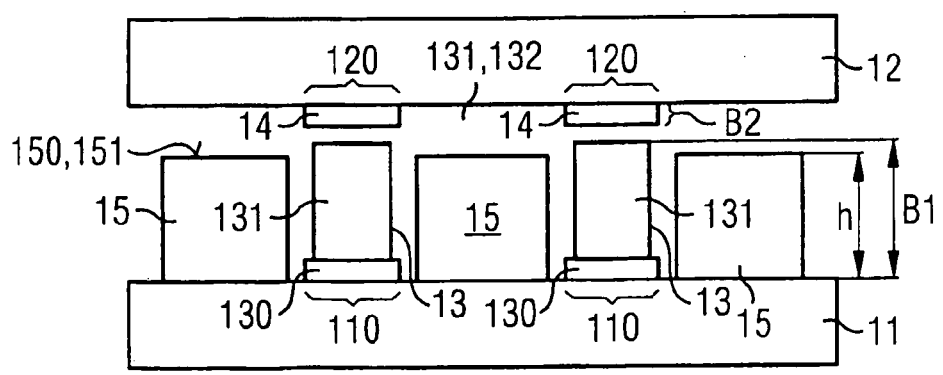
Figure 2D:
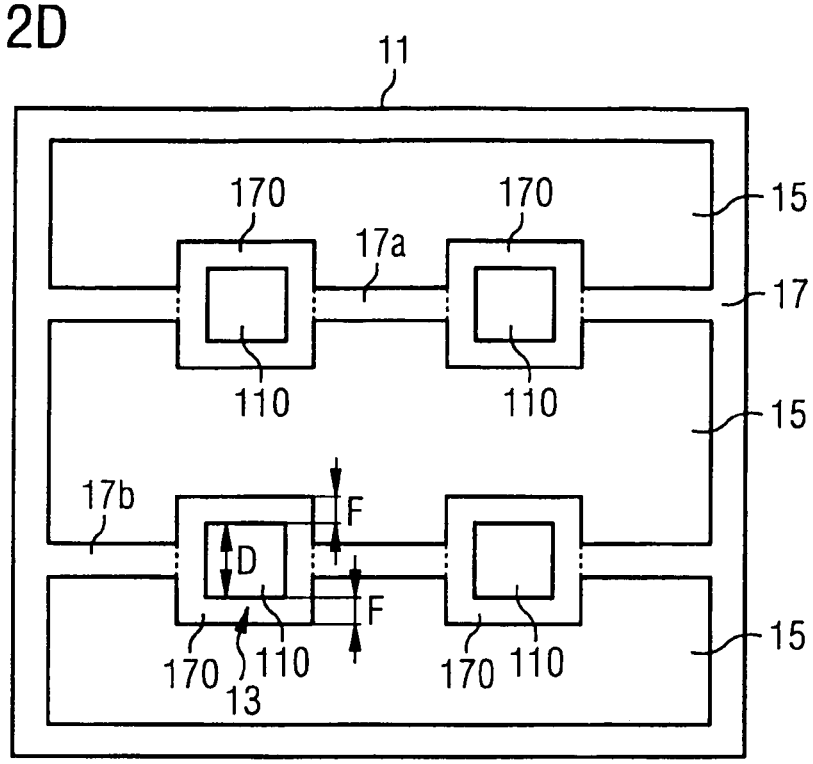
Figure 2E:
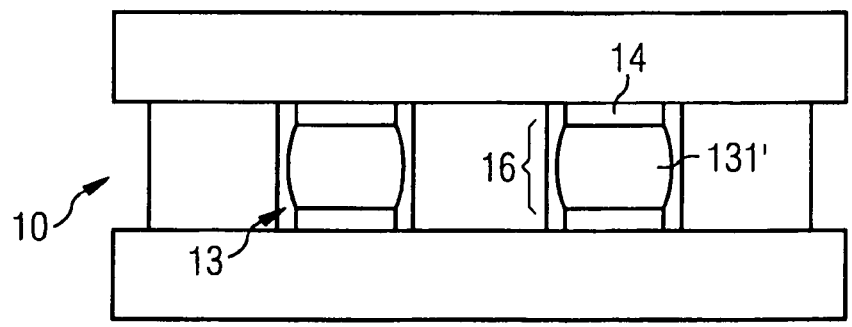

In FIG. 2c, a cross-section through the first substrate 11 is shown again, the support layer 15 having already been structured in the present case. In addition, a second substrate 12 which is present as electronic component or electronic element is shown, the second substrate having second contact elements 14 which have respectively one contact surface 120. The structuring of the support layer 15 which is shown in FIG. 2D as a view is configured such that an opening with a diameter of 45 µm (or 45×45 µm in the case of a square) is introduced into the BCB in the region of the contact elements 13, 14. This leads to a partial base area 170 being produced around the contact surface 110, which partial base area is defined, as evident from FIG. 2d, by the square with the dimension D+F which surrounds the contact surface 110 with the dimensioned D and prescribes the contour of a part of the purging channel. The partial base areas 170 are thereby part of a partial surface 17 of the first substrate, the partial surface 17 not being covered by the support layer 15. The channel which is designated purging channel is formed, in FIG. 2d, by the spacing between contact elements 13, 14 or contactings 16 and the support layer 15 and an exposed connection part 17a in the support layer 15 between the partial base areas 170 or contactings 16, and in addition a connection part 17b is a component of the channel to the exterior. The partial surface 17 comprises these connection parts 17a, 17b. In FIG. 2d, two channels with respectively two connection parts 17b, termed inlet and outlet, are hence produced. Although a purging channel in FIG. 2d is configured to be continuous with one inlet and outlet, a single inlet for the purging is sufficient. As emerges clearly from FIG. 2c, the height of the first contact element 13 is B1. The height of the second contact element 14 is B2. If the heights B1 and B2 are added, a greater height than the height h of the support layer 15 is produced in the sum.

Although the BCB is not yet crosslinked, i.e. still adhesive, in addition an optional adhesive layer 151 is applied on the surface 150 of the support layer 15 which is orientated towards the second substrate 12. As a result of the fact that the partial base area 170 introduced in the support layer 15 completely surrounds the contact surface 110, sufficient tolerance in the positioning of the second substrate 12 is provided.

During the subsequent adhesion and thermocompression-bonding, the bump 131 is reduced from a first height of e.g. 25 µm to a second height, e.g. 15 µm, the diameter widening because of the volume constancy, e.g. from 30 µm to approx. 39 µm. The compressed bump 131' is connected to the second contact element 14 to form an electrical contacting 16. After the adhesion and thermocompression-bonding, the electronic component arrangement 10 is finished. As emerges clearly from FIG. 2c or 2e, the support layer 15 does not touch the first or second contact elements 13, 14 nor the electrical contacting 16 so that the purging channel is formed between these elements. However, it would also be possible to choose the size of the base partial surface 170 such that the electrical contacting 16 touches the support layer, the first and second contact elements not touching the protective layer 15 before being connected to each other but a purging channel remaining furthermore in the region of the contact surfaces. Furthermore, it is possible that the support layer 15 is removed such that the partial base area 170 corresponds to the contact surface 110.

Although, in the present embodiment, both the support layer 15 and the bump 131 are disposed on the first substrate 11, it is likewise possible to configure the bumps as part of the second contact elements 14, then an additional bump on the first contact element 13 being dispensed with. The support layer 15 is applied in turn on the first substrate 11. Alternatively, application of the support layer can also be effected on the second substrate 12.

In FIG. 3a or 3b, an alternative embodiment of the component arrangement is represented. A support layer 15' is again applied on the first substrate 11 configured as circuit carrier, which support layer 15' consists, in the present case, of an already crosslinked polymer and is covered with an additional adhesive layer 151. The height h of the support layer 15' is less than the added height B1 and B2 of the first and second contact elements. The first contact elements 13 consist of a bump 132 on which a metallic foam 133 is applied. The metallic foam can be compressed because of its porosity so that it becomes compressed, during thermocompression-bonding of the first substrate 11 to the second substrate 12 present as optical element without the diameter of the first and second contact elements changing substantially. As a result, an electrical contacting 16' which is the same in its base area and is part of the component arrangement 10' is produced. In FIG. 3b, in particular the compressed metallic foam 133' is visible.

Contrary to the preceding embodiment example, the support layer 15' was firstly applied on the first substrate 11 before the first contact elements 13 were applied on this. Therefore, only the contact surfaces or the partial base areas 170, as shown in FIG. 2d, were structured or exposed and the first contact elements 13 were only subsequently produced on the first substrate. Of course, it is also possible here to apply merely metallisations like the contact pads 130 and to configure the bump as part of the second contact element 14.

Figure 4A:
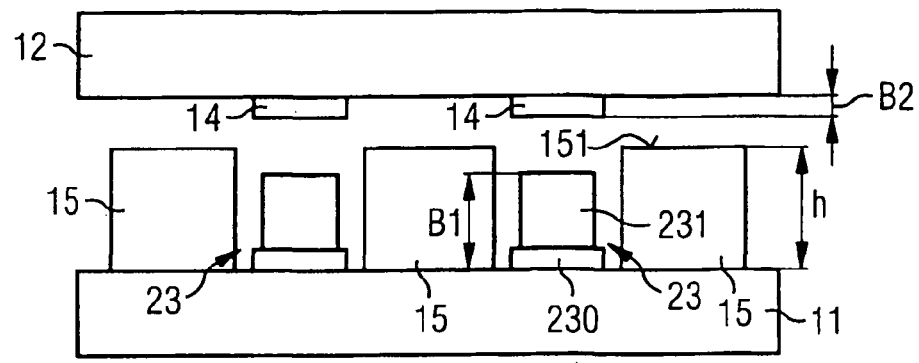

In FIGS. 4a to 4d, a method variant for the production of a component arrangement is represented, in which the first and second contact elements are connected to each other by means of remelting. In FIG. 4a, a first substrate 11 on which firstly a support layer 15 is applied is shown. The support layer has a height h, the height h for example being 50 μm. An adhesive layer 151 is situated on the support layer 15 since the polymer of the support layer 15 which is used has already cured. On the first substrate 11 there are situated two contact elements 23, these being constructed from an under-metallisation 230 and a bump 231 applied thereon. The first contact elements 23 are introduced thereby after the structuring of the support layer 15 in the partial base areas 170, as shown in FIG. 2d. Of course, it is also possible here to configure the bumps not as part of the first contact elements 23 but as part of the second contact elements 14. The added height B1 and B2 of the first and second contact elements 23 or 14 is less than the height h of the support layer 15.

Figure 4B:
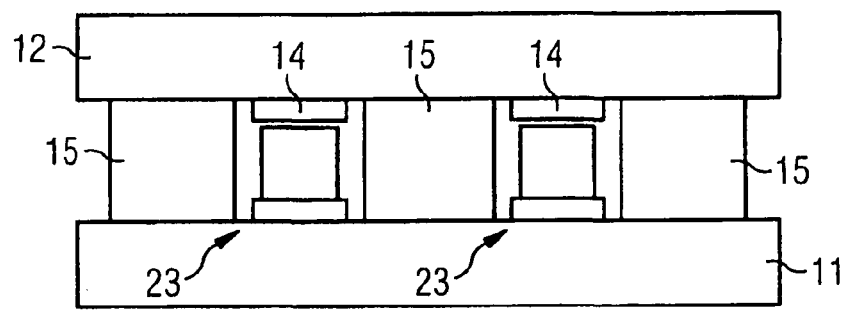

As is evident from FIG. 4b, after connection of the first substrate 11 to the second substrate 12 configured as micromechanical element, an integral connection between these two components is provided merely by the support layer 15. There is no electrical contacting between the first contact elements 23 and the second contact elements 14.

Figure 4C:
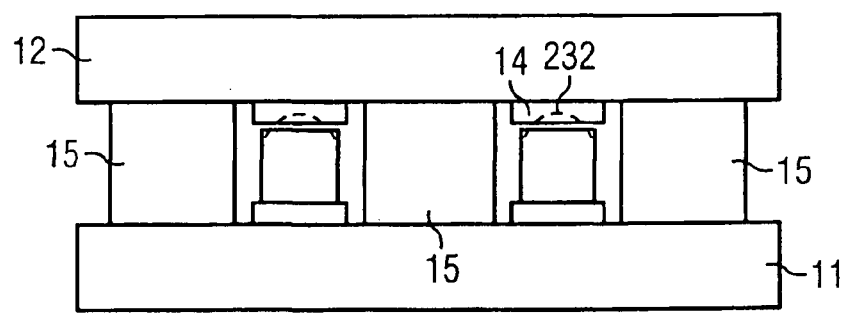
Figure 4D:
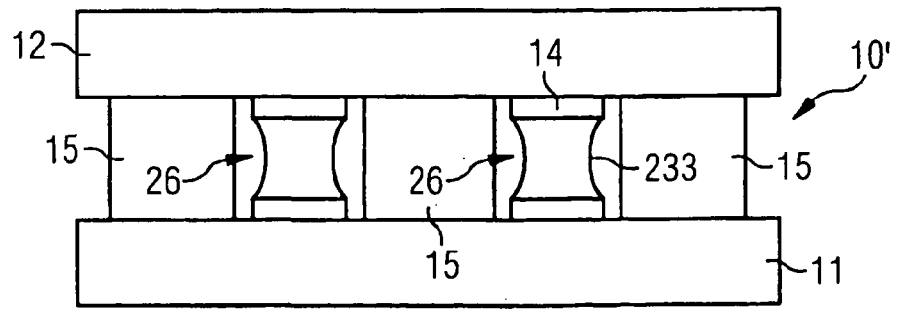

Since, as is evident from FIG. 2d, the partial surface 17 is a continuous area and at least one channel is formed, cleaning of the oppositely situated contact surfaces of the first contact elements 23 and of the second contact elements 14, for example with a hydrogen-containing atmosphere, can be undertaken after connection of the first substrate 11 to the second substrate 12. As a result, a possible oxidation of the contact surfaces is reduced. In the case of the not yet finished electronic component arrangement of FIG. 4b, the first substrate 11 is already glued to the second substrate 12. After cleaning with a gas, the temperature is increased such that the bumps 231 melt and attempt to adopt a spherical shape 232 because of the changed aggregate state, as is illustrated in FIG. 4c. Since the spherical surface of the spherical shape 232 is in contact however firstly with the second contact element 14, the entire contact surface of the second contact element 14 is wetted so that an electrical contacting 26 with a hyperbolic bump 233 is produced, as shown in FIG. 4d. An integral connection between the first substrate 11 and the second substrate 12 is now provided both by the support layer and by the electrical contactings. Although the embodiments shown in FIGS. 2 to 4 have respectively a separate support layer 15, the support layer 15 can also be produced by a structuring, for example of a wafer configured as circuit carrier itself, openings being configured in the latter, into which openings the contact metallisations are introduced and the remaining surface of the structured first substrate is provided with an adhesive layer and subsequently connected to a second substrate configured for example as an electronic component. A silicon wafer would therefore have grooves, the bases of the grooves forming the partial base area and the first contact elements being disposed in said grooves, the first contact elements preferably not touching the walls of the grooves.

Figure 5A:
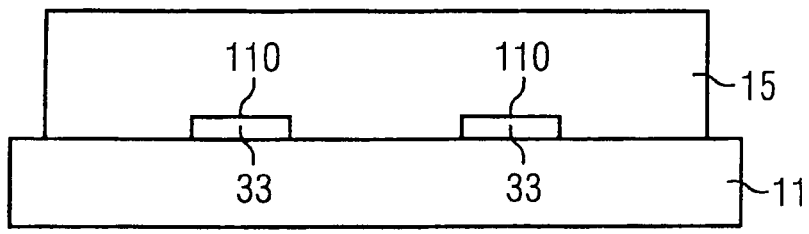
Figure 5B:
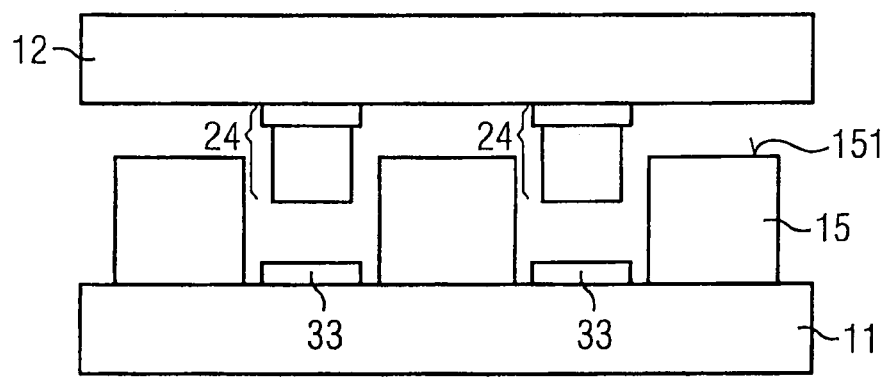
Figure 5C:
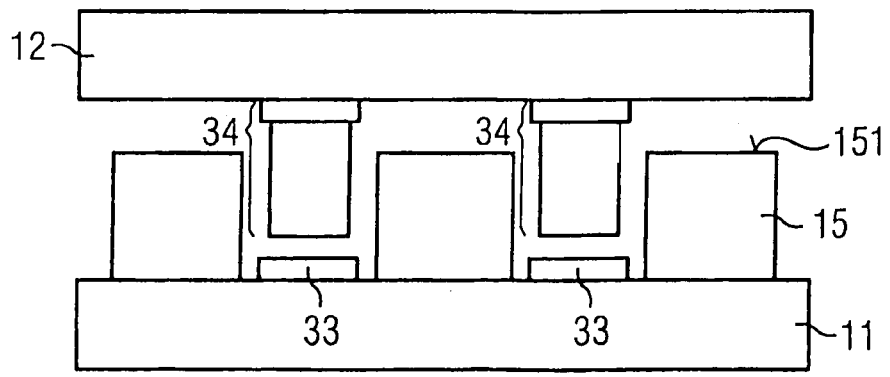

In FIGS. 5a to 5c, an alternative embodiment of a component arrangement is represented, the bumps hereby being configured as parts of the second contact elements. In FIG. 5a, a first substrate 11, configured as electronic element, with first contact elements 33 can be seen, on which substrate firstly a support layer is applied as a cover. In a method step between FIGS. 5a and 5b or 5c, the support layer 15 is structured in a subtractive process so that the contact surfaces 110 of the first contact elements 33, which are orientated away from the first substrate 11, are not covered but exposed. The support layer 15 thereby has an additional adhesive layer which enters into an integral connection with the surface of the second substrate 12 configured as circuit carrier. In FIG. 5b, essentially the method variant of FIG. 4 is represented, i.e. that the added height of the first and second contact elements is less than the height of the support layer. The connection of the contact surfaces to form an electrical contacting is effected by means of soldering or remelting. In FIG. 5c, essentially the method of FIG. 2 is described, i.e. compression with ultrasonic welding or a thermocompression.

Figure 6A:
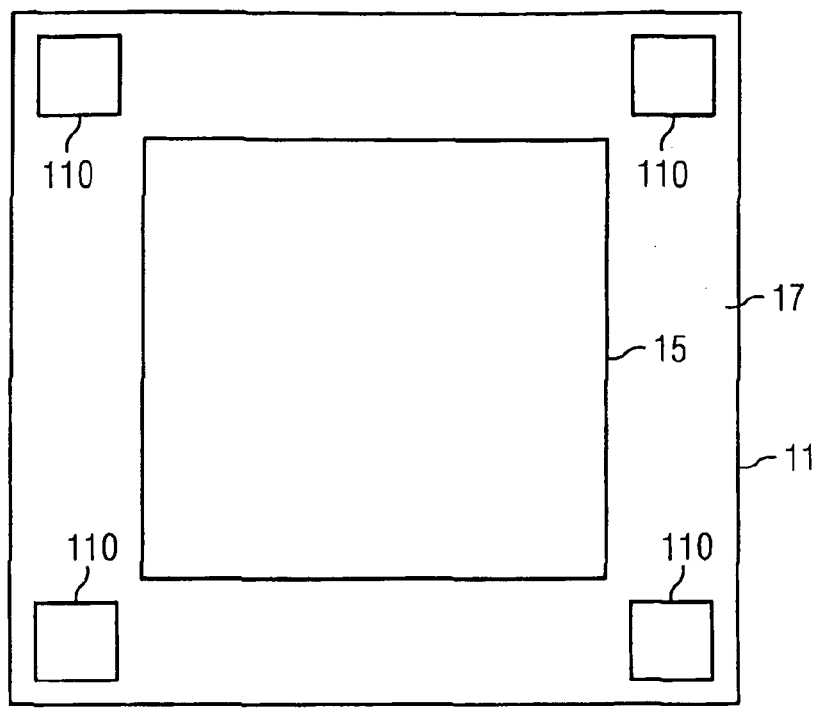
Figure 6B:
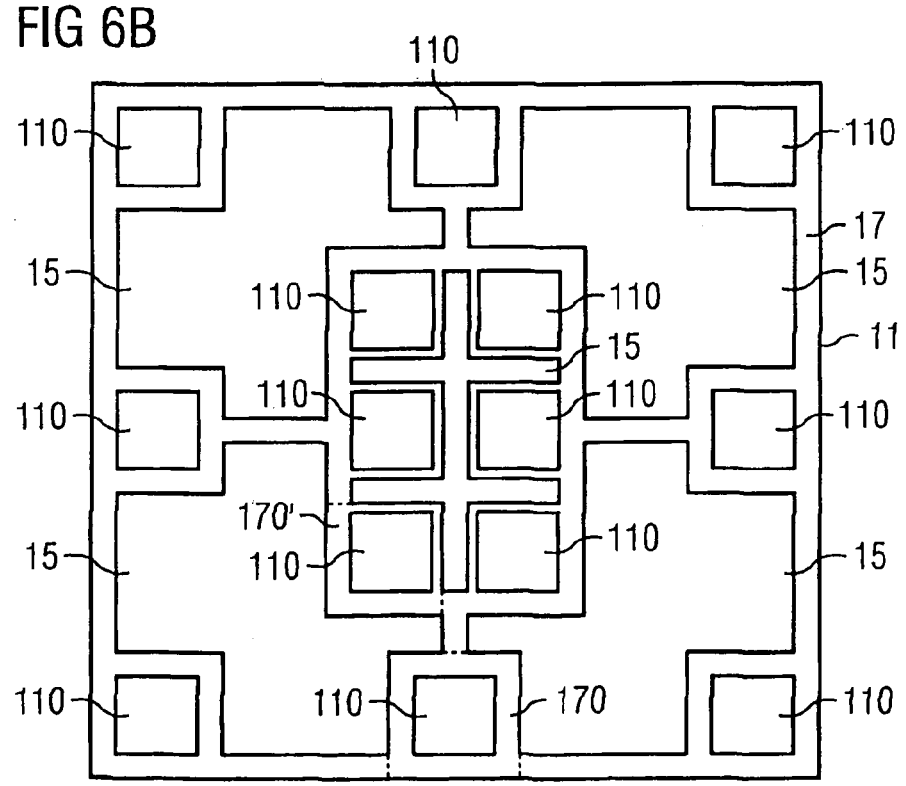

With reference to FIGS. 6a to 6c, different structurings or geometries of support layers are intended to be represented. In FIG. 6a, a particularly simple geometry of a support layer 15 is shown. On a first substrate 11, first contact elements having a contact surface 110 are applied, all the contact elements being situated in the periphery of the first substrate 11. The geometry of the support layer 15 is chosen such that this covers a large area in the centre of the first substrate 11. The partial surface 17 not covered by the support layer 15 surrounds all the contact surfaces 110. In the case of such an embodiment, the support layer 15 can for example simply be printed on or pressed on so that structuring after application of the support layer 15 can be dispensed with.

In FIG. 6b, a complicated geometry of arrangements of first contact elements on a first substrate 11 is represented. In the view, the contact surfaces 110 and also five segments of the support layer 15 which are not connected to each other can be seen, the structuring of the support layer 15 having been undertaken in a subtractive process. The structuring is thereby chosen such that the partial surface 17 is connected many times, which means that one passes from each point of the surface 17 to any other point of the surface 17 without requiring to move out of the plane of the surface 17, i.e. a continuous purging channel surrounds all the contact elements. In order to make the concept of the partial base area more comprehensible, two partial base areas 170 and 170' of different sizes are illustrated. The size of the base area 170 here is for example 150% of the contact surface 110, the size of the base area 170' in contrast is for example 120% of the contact surface 110.

In FIG. 6c, the underside of a second substrate 12' is shown, which is configured as electronic component like an unhoused integrated circuit and in the case of which the structured support layer 15 does not cover and does not touch the contact surfaces 120 of the second contact elements. In addition, a cavity 19, which is not connected to the partial surface 17, is situated on the underside of the second substrate 12', a sensor element 20 being disposed in the cavity 19. The sensor element 20 can concern a pressure- or acceleration sensor, but also a gas-, chemo- or biosensor. Alternatively, other or further components, such as e.g. SAW filters, ultrasonic sensors, antennae or other power elements, can be introduced into the cavity 19. As a result of the fact that the cavity 19 is not connected to the partial surface 17 and is surrounded completely by the support layer after assembly with a first substrate, the elements disposed in the cavity 19 are well protected from external influences without the measuring results of the sensors being falsified.

If the substrate 12' configured as electronic component of FIG. 6c is replaced for example by a CMOS camera wafer, it is possible to produce a camera chip with a module carrier made of glass, a glass substrate forming the first substrate and the camera chip forming the second substrate. For this purpose, the CMOS camera wafer is firstly thinned to 50 μm and encompassed at the top by a handling wafer by the front side. A support structure is thus applied and locally exposed around the contact surfaces and, in the same step, the surface with the pixel sensors is exposed, i.e. the cavity is produced. The wafer is subsequently sawn and the CMOS camera chips are separated. A glass substrate with electrical strip conductors for the wiring and contact structures is provided with mechanical gold stud bumps. The CMOS camera chip with the support structure is immersed in a thinly applied adhesive, a thin adhesive film being picked up. By means of thermocompression, the contact terminals are welded to the mechanical gold stud bumps on the glass substrate and the support structure is glued to the glass at the same time.

Figure 7A:
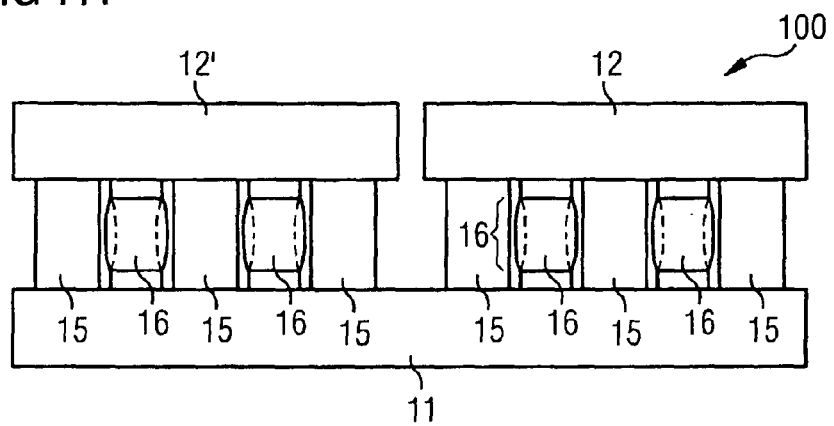
Figure 7B:
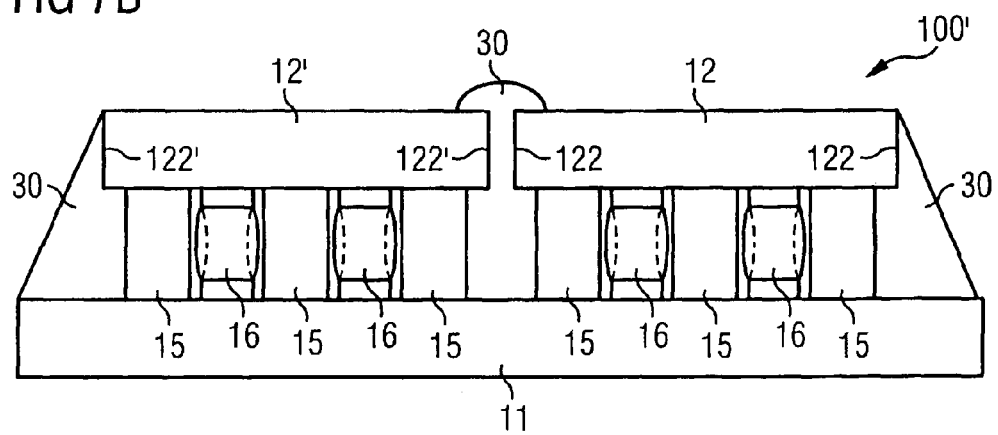

In FIG. 7a, a component arrangement 100 is shown, in which a plurality of second substrates 12, 12' are disposed in a planar manner on a first substrate 11. Between respectively a second substrate 12 or 12' and the first substrate, the support structure 15, which is assigned to the respective second substrate 12 or 12', and the electrical contactings 16 are situated. The second substrate 12' can thereby be an electronic element and the second substrate 12" a further circuit carrier or likewise an electronic, optical or micromechanical element. In this way, a wafer serving as first substrate can be completely fitted out and only later separated. In FIG. 7b, a further embodiment variant of a component arrangement 100' is shown, in which the second substrates 12 or 12' are disposed in a planar manner on the first substrate 11. In addition, the edges 122 or 122' of the second substrates 12 or 12' are connected respectively to the first substrate 11 by an encapsulation compound 30. By filling the gap between the adjacent second substrates 12 or 12', the edges of the second substrates 12 or 12' are protected in addition.

Figure 8:
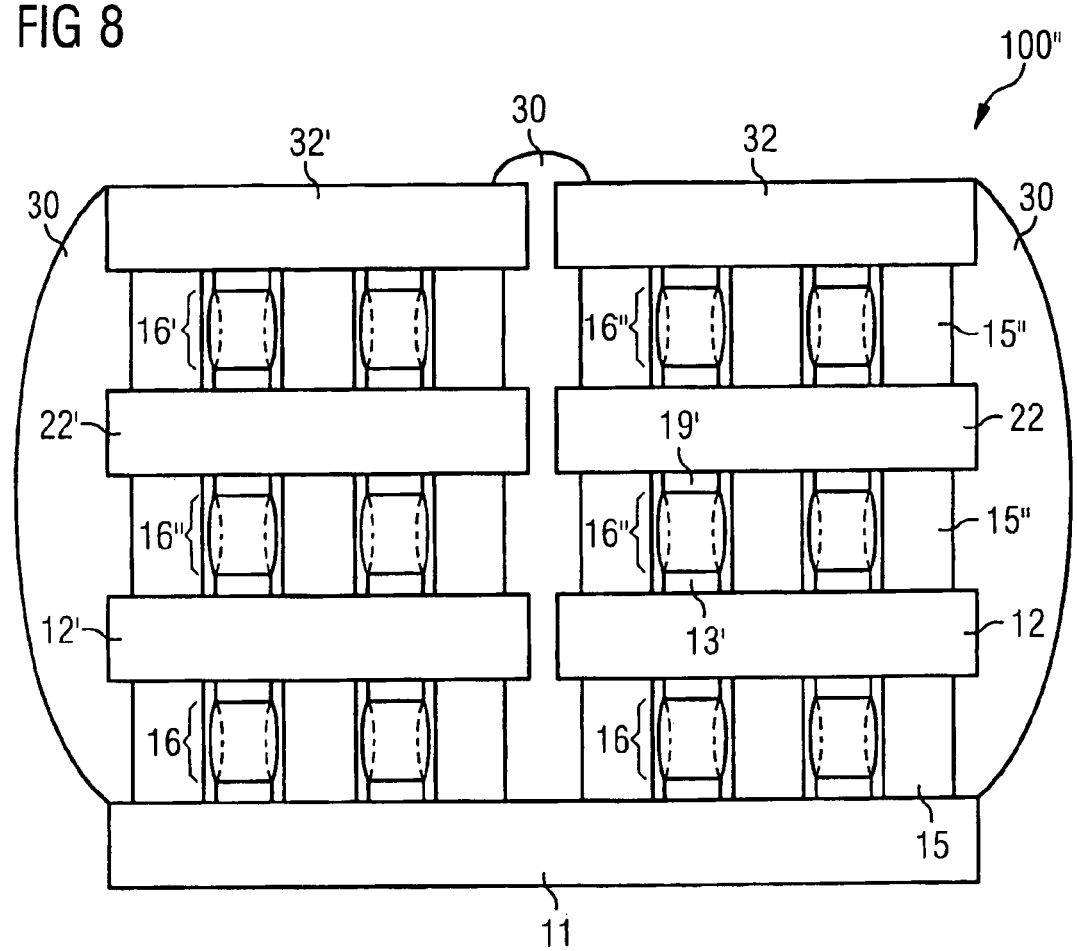

In FIG. 8, a stacked construction of electronic components is represented. On a first substrate 11, firstly two second substrates 12 or 12' configured as electronic elements are disposed adjacently in a planar manner. On the second substrates 12 or 12', respectively a further substrate 22 or 22' which is configured as an electronic, optical or micromechanical element, is applied, the second substrates 12 or 12' having further first contact elements 13 on the surface thereof orientated away from the first substrate 11, which first contact elements are connected to the further second contact elements 14' of the further second substrates 22 or 22'. A further support layer 15" is situated therebetween.

On the further second substrates 22 or 22', again further second substrates 32 or 32' are disposed so that a stack of second substrates is produced on a first substrate 11. During production of such a three-dimensional component arrangement 100", advantageously first and second contact elements are used, the added height of which is less than the height of the respective support layer 15 or 15". Firstly the second substrates are thereby disposed on the first substrate or the further second substrates on the second substrates so that the result is an integral connection between first substrate, support layer, second substrate and also the second substrate, the support layer and the further second substrate. Only subsequently are the second substrates which are stacked thus but not yet connected electrically to each other produced in a single process step since all the bumps are melted contemporaneously by a temperature increase (see method as described in FIG. 4) and all the electrical contactings 16 or 16" are produced. The stack arrangement is supplied with purging gas before the electrical connection in order to clean all the contact surfaces of the various contact elements.

The invention claimed is:

1. A method for the production of a component arrangement, having a first substrate and at least one second substrate which is to be disposed on the first substrate, the first substrate having at least one first contact element and the at least one second substrate having at least one second contact element which corresponds to the at least one first contact element for mutual contacting, and the method comprising the following steps:

a) application of the at least one first and second contact element, the at least one first and second contact element respectively having a contact surface;

b) application of a support layer on the first substrate, the support layer not covering a partial surface of the first substrate and the partial surface surrounding the contact surface of the at least one first contact element; and/or application of a support layer on the at least one second substrate, the support layer not covering a partial surface of the at least one second substrate and the partial surface surrounding the contact surface of the at least one second contact element;

c) connection of the contact surface of the at least one contact element to the corresponding contact surface of the at least one second contact element for the production of an electrical contacting, at least two contactings being provided and the support layer being structured such that the partial surface of the first substrate or the partial surface of the at least one second substrate respectively forms a connected area in which the contactings are situated, and a channel connected to the exterior being produced between support layer and the contactings.

2. The method according to claim 1, wherein a circuit carrier or at least one electronic, optical or micromechanical component which is present in the wafer composite is chosen as first and/or as at least one second substrate.

3. The method according to claim 1, wherein the support layer does not touch the electrical contactings.

4. The method according to claim 1, wherein the support layer is applied on the first substrate and/or the at least one second substrate and a surface of the support layer which is orientated away from the first substrate or away from the at least one second substrate is supplied with an adhesive and/or the support layer is adhesive.

5. The method according to claim 1, wherein the added height of the at least one first and second contact element is greater than the height of the support layer before connection of the contact surfaces and in that the contact surfaces are connected to each other by means of shaping and the support layer connects the first substrate and the at least one second substrate in addition.

6. The method according to claim 5, wherein the contact surfaces are connected to each other by means of thermocompression.

7. The method according to claim 1, wherein the added height of the at least one first and second contact element is less than the height of the support layer before connection of the contact surfaces and firstly the support layer connects the first substrate and the at least one second substrate and subsequently the contact surfaces are connected to each other by means of soldering or remelting.

8. The method according to claim 1, wherein a gas for purging is introduced into the channel before connection of the contact surfaces.

9. A component arrangement, having a first substrate and at least one second substrate which is disposed on the first substrate, the first substrate having at least one first contact element and the at least one second substrate having at least one second contact element and the contact elements having each one contact surface respectively the contact elements being connected to form an electrical contacting and a support layer connecting the first substrate and the at least one second substrate and the support layer being applied such that a partial surface of the first substrate and a partial surface of the at least one second substrate are not covered by the support layer, the partial surface surrounding the respective contact surface of the at least one first and second contact element and the electrical contacting produced between the contact surfaces not touching the support layer, at least two contactings being formed and the support layer being structured such that the partial surface of the first substrate or the partial surface of the at least one second substrate respectively forms a connected area in which the contactings are situated, and a channel being formed between support layer and the contactings.

10. The component arrangement according to claim 9, wherein the first and/or the at least one second substrate is a circuit carrier or at least one electronic, optical or micromechanical component which is present in the wafer composite or separate.

11. The component arrangement according to claim 9, wherein the first and/or the at least one second substrate is a circuit carrier or at least one electronic, optical or micromechanical component which is present in the wafer composite.

12. The component arrangement according to claim 9, wherein the first substrate has a large number of first contact elements and the at least one second substrate has a large number of second contact elements which correspond to the large number of first ones and each contact element occupies a contact surface and the support layer is structured such that the electrical contactings produced between the contact surfaces do not touch the support layer.

13. The component arrangement according to claim 9, wherein the support layer consists of an adhesive polymer or a polymer layer, an oxide layer, a metal layer or a silicon layer with an applied adhesive layer.

14. The component arrangement according to claim 9, wherein the partial surface of the first substrate or of the at least one second substrate surrounds a partial base area and the partial base area respectively surrounds a contact surface of the at least one first or second contact element completely and has a size of at least 120% of the size of the respective contact surface, the partial base areas of the at least two electrical contactings being connected by a connection surface.

15. The component arrangement according to claim 9, wherein the partial surface of the first substrate or of the at least one second substrate surrounds a partial base area and the partial base area respectively surrounds a contact surface of the at least one first or second contact element completely and has a size of at most 300% of the size of the respective contact surface, the partial base areas of the at least two electrical contactings being connected by a connection surface.

16. The component arrangement according to claim 9, wherein the support layer has a cavity and the at least one second substrate in the cavity surrounds at least one sensor element, an optical or a micromechanical element.

17. The component arrangement according to claim 9, wherein a further second substrate is stacked on the at least one second substrate the at least one second substrate on a surface which is orientated away from the at least one second contact element having at least one further first contact element with a contact surface and the at least one further second substrate having at least one further second contact element with a contact surface which is connected to the at least one further one and a further support layer being applied between the at least one second substrate and the at least one further second substrate such that the contact surfaces of the at least one further first and further second contact element do not touch the further support layer.

18. The component arrangement according to claim 9, wherein the at least one second substrate has an edge and an encapsulation is applied between the substrate and the edge of the at least one second substrate.

\* \* \* \* \*

UNITED STATES PATENT AND TRADEMARK OFFICE
CERTIFICATE OF CORRECTION

PATENT NO. : 8,564,969 B2  Page 1 of 1
APPLICATION NO. : 13/138440
DATED : October 22, 2013
INVENTOR(S) : Oppermann et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 251 days.

Signed and Sealed this
Fifteenth Day of September, 2015

Michelle K. Lee
*Director of the United States Patent and Trademark Office*